(12) United States Patent  
Hagio

(10) Patent No.: US 9,136,224 B2  
(45) Date of Patent: Sep. 15, 2015

(54) ALIGNMENT MARK, PHOTOMASK, AND METHOD FOR FORMING ALIGNMENT MARK

(71) Applicant: Kabushiki Kaisha Toshiba, Minato-ku (JP)

(72) Inventor: Yoshinori Hagio, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 15 days.

(21) Appl. No.: 14/152,116

(22) Filed: Jan. 10, 2014

(65) Prior Publication Data

US 2015/0008598 A1    Jan. 8, 2015

(30) Foreign Application Priority Data

Jul. 8, 2013   (JP) ................................ 2013/142560

(51) Int. Cl.  
*H01L 23/544* (2006.01)

(52) U.S. Cl.  
CPC ....... *H01L 23/544* (2013.01); *H01L 2223/5442* (2013.01); *H01L 2223/54426* (2013.01); *H01L 2223/54453* (2013.01)

(58) Field of Classification Search  
CPC .................. H01L 23/544; H01L 2223/54453; H01L 2223/54426; H01L 27/14687; H01L 21/681; H01L 2221/68327; G01N 21/9501  
See application file for complete search history.

(56) References Cited

U.S. PATENT DOCUMENTS

| | | | |
|---|---|---|---|
| 8,039,196 B2 | 10/2011 | Kim et al. | |
| 2007/0187875 A1* | 8/2007 | Terasaki et al. | 264/496 |
| 2012/0149211 A1* | 6/2012 | Ojima | 438/758 |
| 2013/0075360 A1 | 3/2013 | Nakamura et al. | |

FOREIGN PATENT DOCUMENTS

JP    2010-153697    7/2010

* cited by examiner

*Primary Examiner* — Roy Potter  
(74) *Attorney, Agent, or Firm* — Oblon, McClelland, Maier & Neustadt, L.L.P.

(57) ABSTRACT

According to one embodiment, an alignment mark provided on an underlayer includes a plurality of first guide pattern features, and a first self-assembled film. The first guide pattern features extend in a first direction and are aligned in a second direction crossing the first direction. The first self-assembled film is provided between adjacent ones of the first guide pattern features and includes a plurality of first line pattern features and a second line pattern feature. The first line pattern features extends in the first direction, is aligned in the second direction, and has a pitch in the second direction narrower than a pitch in the second direction of the first guide pattern features. The second line pattern feature is provided between adjacent ones of the first line pattern features and extends in the first direction.

16 Claims, 8 Drawing Sheets

FIG. 4A
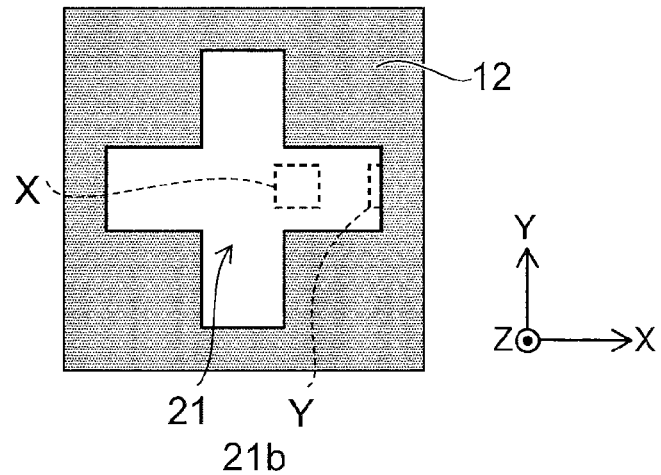
FIG. 4B
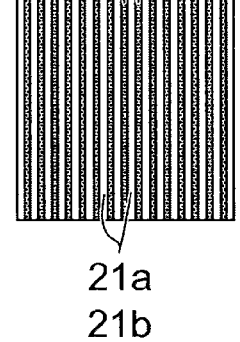
FIG. 4C
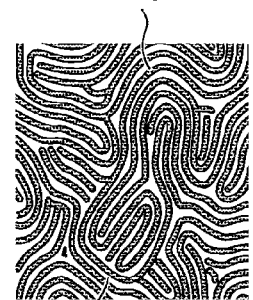
FIG. 4D

ALIGNMENT MARK, PHOTOMASK, AND METHOD FOR FORMING ALIGNMENT MARK

CROSS-REFERENCE TO RELATED APPLICATIONS

This application is based upon and claims the benefit of priority from Japanese Patent Application No. 2013-142560, filed on Jul. 8, 2013; the entire contents of which are incorporated herein by reference.

FIELD

Embodiments described herein relate generally to an alignment mark, a photomask, and a method for forming the alignment mark.

BACKGROUND

In a photolithography process, a pattern formation method using directed self-assembly (DSA) technology (hereinafter, DSA technology) is drawing attention. In this method, a block copolymer is microphase-separated along a guide pattern to form a fine pattern. Thus, pattern formation exceeding the resolution limit of conventional photolithography technology is enabled.

On the other hand, the area of an alignment mark used for alignment in a wafer process is 100 times to 1000 times the area of a device pattern. Thereby, the visibility of the alignment mark in image recognition is improved.

However, in the pattern formation method using directed self-assembly technology, a block copolymer may be applied also to the region of the alignment mark during the process. In such a case, if the block copolymer phase-separates irregularly in this region, the alignment mark will result in having portions of light and dark contrast. In such a state, the function of the alignment mark may be lost.

BRIEF DESCRIPTION OF THE DRAWINGS

FIG. 4A and FIG. 4D are schematic plan views showing an alignment mark according to the reference example, FIG. 4B is an enlarged view of a portion Y of FIG. 4A, and FIG. 4C is an enlarged view of a portion X of FIG. 4A;

DETAILED DESCRIPTION

Figure 1A:
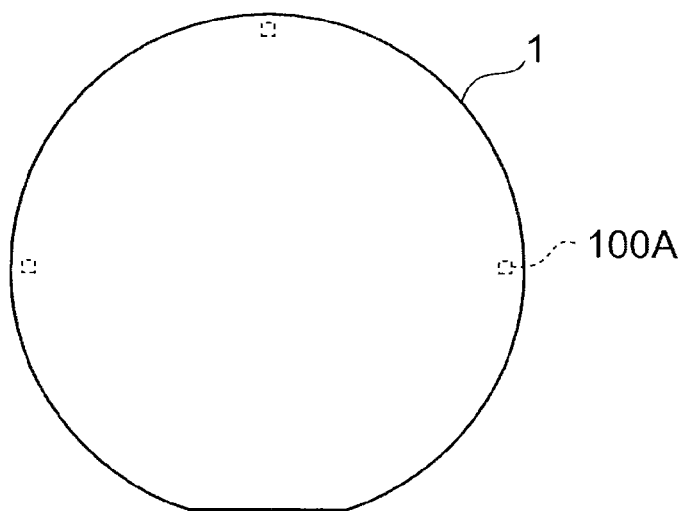
FIG. 1A is a schematic plan view showing a state where alignment marks according to a first embodiment are provided on an underlayer.

According to one embodiment, an alignment mark provided on an underlayer includes a plurality of first guide pattern features, and a first self-assembled film. The first guide pattern features extend in a first direction and are aligned in a second direction crossing the first direction. The first self-assembled film is provided between adjacent ones of the first guide pattern features and includes a plurality of first line pattern features and a second line pattern feature. The first line pattern features extends in the first direction, is aligned in the second direction, and has a pitch in the second direction narrower than a pitch in the second direction of the first guide pattern features. The second line pattern feature is provided between adjacent ones of the first line pattern features and extends in the first direction.

Various embodiments will be described hereinafter with reference to the accompanying drawings. In the following description, identical components are marked with the same reference numerals, and a description of components once described is omitted as appropriate.

First Embodiment

Figure 1B:
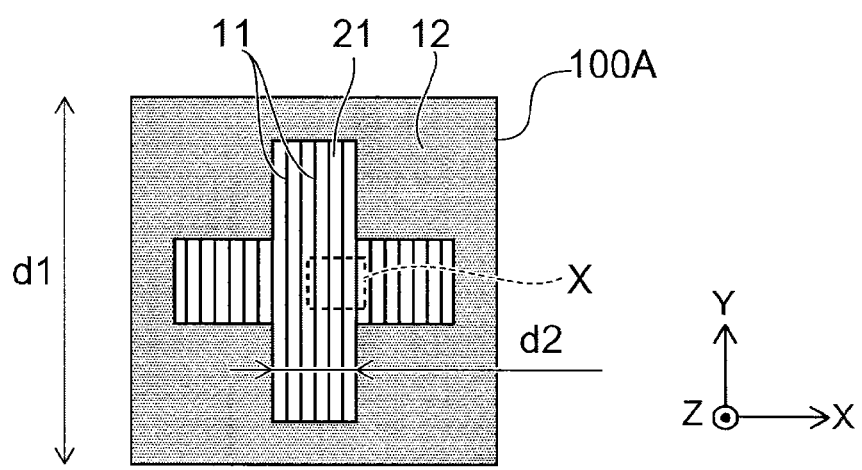
FIG. 1B is an enlarged view of FIG. 1A and is a schematic plan view showing the alignment mark according to the first embodiment.
Figure 1C:
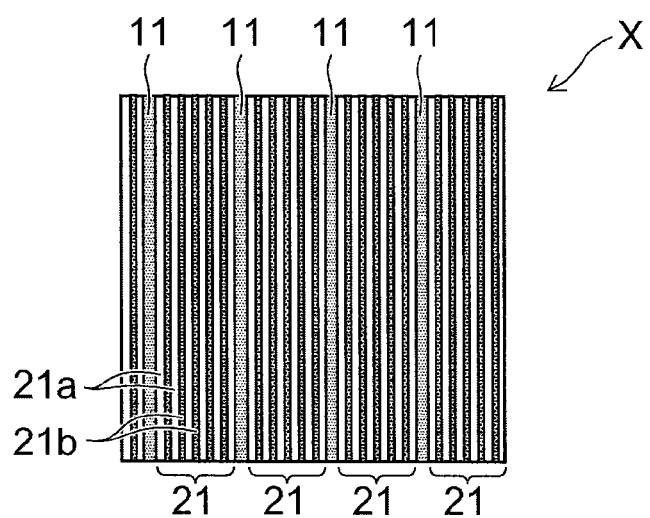
FIG. 1C is an enlarged view of a portion X of FIG. 1B.

FIG. 1A is a schematic plan view showing a state where alignment marks according to a first embodiment are provided on an underlayer, FIG. 1B is an enlarged view of FIG. 1A and is a schematic plan view showing the alignment mark according to the first embodiment, and FIG. 1C is an enlarged view of a portion X of FIG. 1B.

In a wafer process in which a semiconductor element is forming on a wafer substrate, the alignment between a photomask and the wafer substrate is made frequently. An alignment mark 100A is used as a mark serving as a reference for making the alignment. Alignment marks 100A are formed in certain positions on an underlayer 1 as shown in FIG. 1A.

The alignment mark 100A is formed in the wafer process, for example. The underlayer 1 is a silicon wafer, or one of an insulating layer, a semiconductor layer, a metal layer, and the like provided on the upper side of a silicon wafer. FIG. 1A illustrates a silicon wafer as an example of the underlayer 1.

The planar structure of the alignment mark will now be described.

The alignment mark 100A according to the first embodiment includes, in addition to a guide pattern, a layer formed by microphase-separating a block copolymer by directed self-assembly technology (hereinafter, self-assembly technology).

For example, as shown in FIG. 1B, the alignment mark 100A includes a plurality of guide pattern features 11 (first guide pattern features), a guide pattern feature 12 (a second guide pattern feature), and a self-assembled film 21 (a first self-assembled film). The length d1 in FIG. 1B is 20 µm or more, for example, and d2 is approximately 10 µm.

Each of the plurality of guide pattern features 11 extends in the Y-direction (a first direction). The plurality of guide pattern features 11 are aligned in the X-direction (a second direction) crossing the Y-direction. The guide pattern feature 11 is observed with a secondary electron microscope, and has a line width small enough not to be observed with an optical microscope. For example, the width in the X-direction of the guide pattern feature 11 is 30 nm to 100 nm. The pitch in the X-direction of the guide pattern feature 11 is 100 nm to 1 µm.

Each of the plurality of guide pattern features 11 and the guide pattern feature 12 is an organic layer such as a resist layer, a silicon oxide layer, a silicon nitride layer, or the like. The embodiment illustrates, as an example, an organic layer such as a resist layer as the guide pattern feature 11. The guide pattern feature 11 may be a silicon oxide layer, a silicon nitride layer, or the like.

The self-assembled film 21 is provided between guide pattern features 11 (FIG. 1B). The self-assembled film 21 has a plurality of line pattern features 21a (first line pattern features) and a plurality of line pattern features 21b (second line pattern features). The line pattern feature 21a is a layer containing a polystyrene derivative, for example, and the line pattern feature 21b is a layer containing poly(methyl methacrylate) (an acrylic), for example.

The plurality of line pattern features 21a extend in the Y-direction, and are aligned in the X-direction. The pitch of the plurality of line pattern features 21a in the X-direction is narrower than the pitch of the plurality of guide pattern features 11 in the X-direction. Each of the plurality of line pattern features 21b extends in the Y-direction. The line pattern feature 21b is provided between line pattern features 21a.

The self-assembled film 21 is a film formed by microphase-separating a block copolymer by heating. It is assumed that the block copolymer includes two kinds of polymers A and B, for example. In the case where the affinity of the polymer A to the guide pattern feature 11 is stronger than the affinity of the polymer B to the guide pattern feature 11, the polymer A is more likely to gather at the side wall of the guide pattern feature 11 than the polymer B after microphase separation. Subsequently, the polymer B gathers at the side wall of the polymer A that has gathered at the side wall of the guide pattern feature 11. Further, the polymer A gathers at the side wall of the polymer B that has gathered at the side wall of the polymer A. In the end, between adjacent guide pattern features 11, polymers are arranged regularly in the order of ABAB . . . BABA in the X direction, and the polymers extend in the Y-direction.

In the case where the block copolymer includes polystyrene (PS)-poly(methyl methacrylate) (PMMA), the polymer A is polystyrene (PS) and the polymer B is poly(methyl methacrylate) (PMMA), for example.

The plurality of guide pattern features 11 and the self-assembled film 21 are surrounded by the guide pattern feature 12 (FIG. 1B). Although in the embodiment a cross shape is illustrated by the plurality of guide pattern features 11 and the self-assembled film 21 as an example, the configuration is not limited to this.

The manufacturing process in which the alignment mark 100A is formed will now be described.

In the manufacturing process in which the alignment mark 100A is formed, a photomask for transferring the pattern configuration of the alignment mark 100A onto the underlayer 1 is used.

Figure 2A:
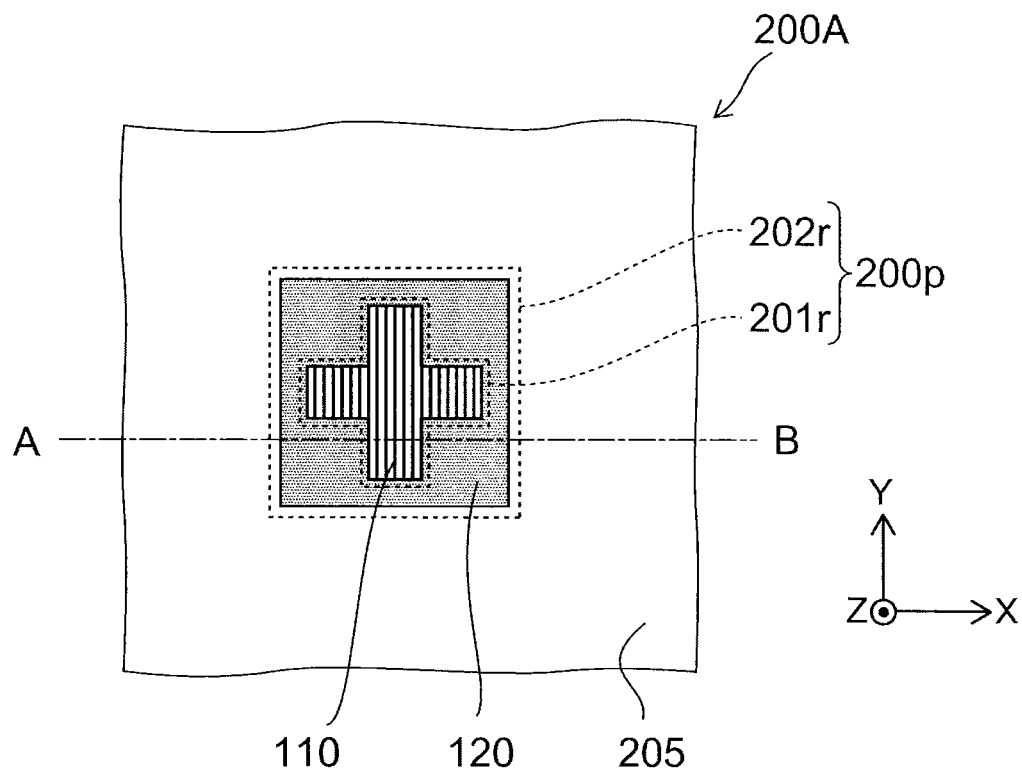
FIG. 2A is a schematic plan view showing a photomask according to the first embodiment.
Figure 2B:
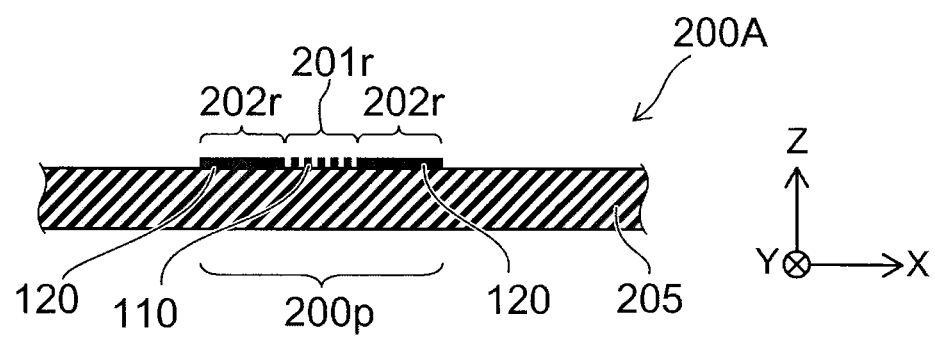
FIG. 2B is a schematic cross-sectional view in a position along line A-B of FIG. 2A.

FIG. 2A is a schematic plan view showing a photomask according to the first embodiment, and FIG. 2B is a schematic cross-sectional view in a position along line A-B of FIG. 2A.

FIG. 2A and FIG. 2B show part of a photomask 200A.

The photomask 200A includes a light transmissive matrix 205 and light blocking films 110 and 120. The photomask 200A has a pattern region 200p where the pattern of the alignment mark 100A can be transferred. The photomask 200A includes, in addition to that pattern region, a pattern region where the pattern of elements, interconnections, etc. can be transferred (not shown).

The pattern region 200p has a pattern region portion 201r (a first pattern region portion) and a pattern region portion 202r (a second pattern region portion) surrounding the pattern region portion 201r. A plurality of light blocking films 110 (first light blocking films) are provided in the pattern region portion 201r. The plurality of light blocking films 110 extend in the Y-direction, and are aligned in the X-direction. The light blocking film 120 is provided in the pattern region portion 202r on the outside of the pattern region portion 201r. The light transmissive matrix 205 is a quartz plate, a glass plate, or the like. The light blocking films 110 and 120 are a metal film containing chromium (Cr) or the like, for example.

Figure 3A:
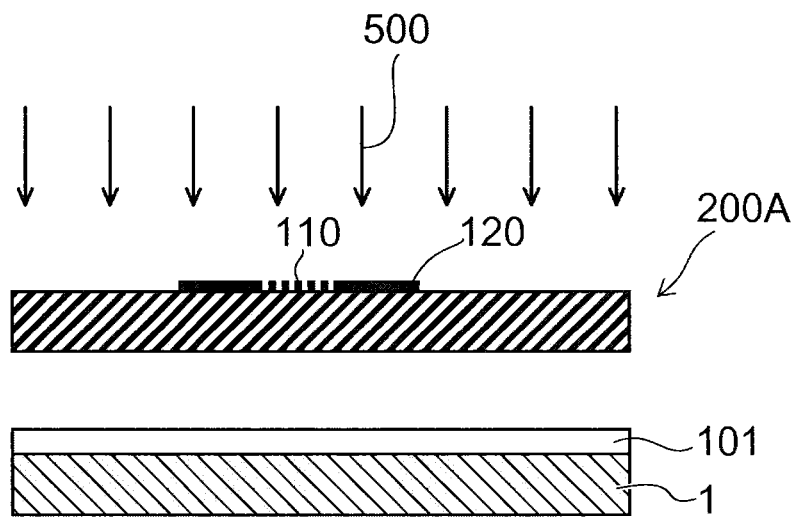
FIG. 3A to FIG. 3C are schematic cross-sectional views showing the manufacturing process in which the alignment mark of the first embodiment is formed.
Figure 3B:
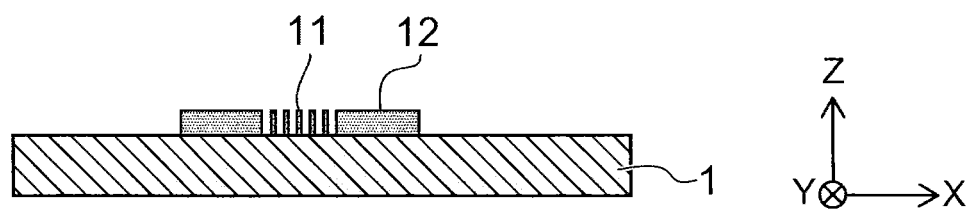
Figure 3C:
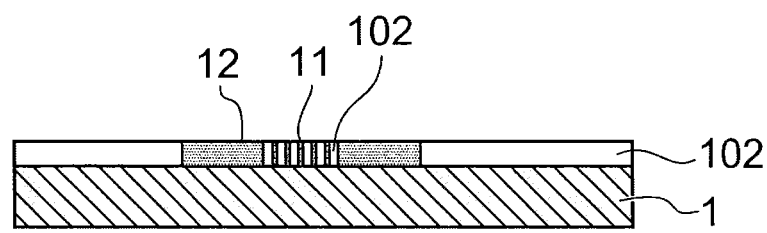

FIG. 3A to FIG. 3C are schematic cross-sectional views showing the manufacturing process in which the alignment mark of the first embodiment is formed.

As shown in FIG. 3A, the photomask 200A is placed above the underlayer 1. A resist 101 has been applied on the underlayer 1 beforehand. Subsequently, light 500 is applied to the resist 101 via the photomask 200A. The light 500 is ArF (argon fluoride) laser light, for example.

Here, a positive resist is selected as the resist 101. The solubility of the exposed portion of the positive resist 101 in a developer (e.g. an alkali solution) is increased. In other words, the not-exposed portion of the resist 101 remains as a guide pattern feature.

Therefore, after the exposure and the development, portions of the resist 101 where the light 500 has been blocked by the light blocking films 110 and 120 and the light 500 has not arrived form guide pattern features. FIG. 3B shows this state.

As shown in FIG. 3B, a plurality of guide pattern features 11 extending in the Y-direction and aligned in the X-direction are formed on the underlayer 1. The guide pattern feature 12 surrounding the plurality of guide pattern features 11 is formed on the underlayer 1.

Although the embodiment illustrates an organic layer such as a resist as the material of the guide pattern feature, it is also possible to form an insulating layer such as a silicon oxide layer and a silicon nitride layer on the underlayer 1 beforehand, and pattern the insulating layer using a resist pattern to obtain insulating pattern features used as guide pattern features (not shown).

Next, as shown in FIG. 3C, a block copolymer layer 102 is formed between guide pattern features 11. The block copolymer layer 102 contains a polystyrene derivative and poly(methyl methacrylate) and an organic solvent that can dissolve these polymers, for example. The block copolymer layer 102 is formed on the underlayer 1 by the spin coating method, for example. Since the block copolymer layer 102 is formed on the underlayer 1 by the spin coating method, the block copolymer layer 102 wetly spreads over the entire upper surface of the underlayer 1. Therefore, the block copolymer layer 102 is formed also on the underlayer 1 outside the guide pattern feature 12.

Subsequently, heating treatment is performed on the block copolymer layer 102. By the heating treatment, the organic solvent is vaporized from the block copolymer layer 102, and the block copolymer layer 102 is microphase-separated. Here, the affinity of the polystyrene derivative to the guide pattern feature 11 is stronger than the affinity of the poly(methyl methacrylate) to the guide pattern feature 11.

Thereby, a structure in which the line pattern feature 21a containing a polystyrene derivative and the line pattern feature 21b containing poly(methyl methacrylate) are alternately arranged is formed between guide pattern features 11. This arrangement structure is already shown in FIG. 1B and FIG.

1C described above. As shown in FIGS. 1B and 1C, each of the line pattern features 21a and 21b is formed along the side wall of the guide pattern feature 11.

Before effects of the first embodiment are described, an alignment mark according to a reference example is described.

FIG. 4A and FIG. 4D are schematic plan views showing an alignment mark according to the reference example, FIG. 4B is an enlarged view of a portion Y of FIG. 4A, and FIG. 4C is an enlarged view of a portion X of FIG. 4A.

In the alignment mark according to the reference example, the guide pattern feature 11 is not provided in the region inside the guide pattern feature 12. In the alignment mark, only the self-assembled film 21 is formed in the region inside the guide pattern feature 12.

In the self-assembled film 21, a structure in which the line pattern feature 21a and the line pattern feature 21b are alternately arranged with regularity is formed in a portion Y near the guide pattern feature 12 (FIG. 4B). This is because the guide pattern feature 12 exists near the portion Y. In other words, this is because a sequential ordered arrangement occurs in which a line pattern feature 21a concentrates at the side wall of the guide pattern feature 12, a line pattern feature 21b concentrates at the side wall of the line pattern feature 21a, and a line pattern feature 21a concentrates at the side wall of the line pattern feature 21b.

However, in a portion X distant from the guide pattern feature 12, a disordered structure is formed in which the line pattern feature 21a and the line pattern feature 21b are not regularly arranged (FIG. 4C). This is because there is no guide pattern feature in the portion X.

In the wafer process, the process is advanced while the alignment mark is recognized by an image to grasp the position and shape of the alignment mark. However, in the case where pattern features in a disordered state and pattern features in an ordered state coexist like the alignment mark according to the reference example, the position and shape of the alignment mark are not grasped with high accuracy by an image recognition means (e.g. an optical microscope). This is because the self-assembled film 21 has significant contrast spots in the case where pattern features in a disordered state and pattern features in an ordered state coexist in the self-assembled film 21 (FIG. 4D).

In contrast, effects of the first embodiment will now be described.

Figure 5A:
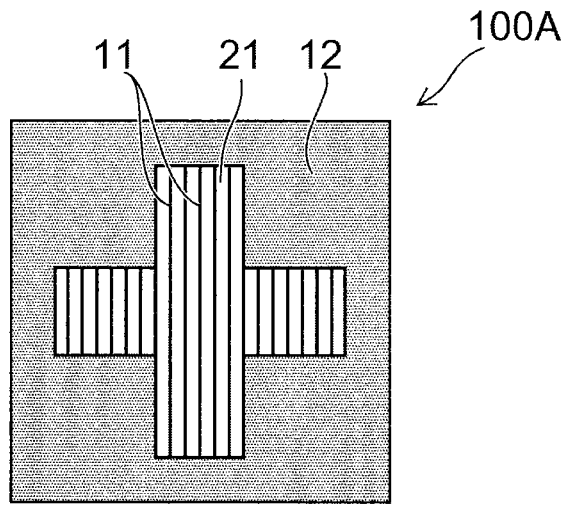
FIG. 5A is a schematic plan view of the alignment mark according to the first embodiment.
Figure 5B:
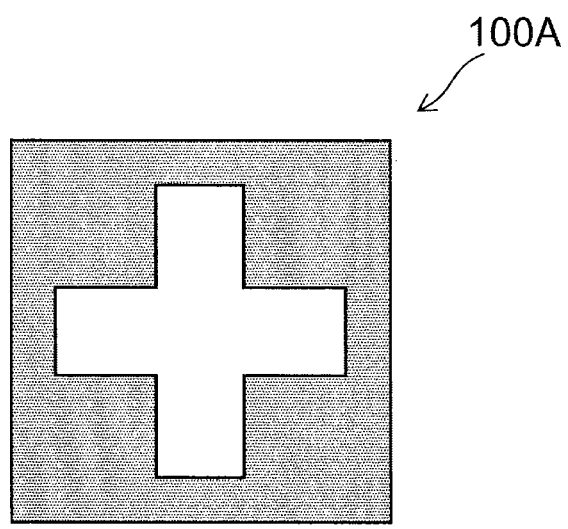
FIG. 5B is a schematic observed image of the alignment mark according to the first embodiment obtained by an image recognition means.

FIG. 5A is a schematic plan view of the alignment mark according to the first embodiment, and FIG. 5B is a schematic observed image of the alignment mark according to the first embodiment obtained by an image recognition means.

The alignment mark 100A according to the first embodiment includes, in addition to the guide pattern feature 12, a plurality of guide pattern features 11. The self-assembled film 21 is provided between guide pattern features 11, and each of the self-assembled films 21 has a structure in which the line pattern feature 21a and the line pattern feature 21b are alternately arranged with regularity (FIG. 5A). Each of the line pattern features 21a and 21b extends in the Y-direction regularly. Therefore, the self-assembled film 21 has no contrast spots, and has uniform contrast. In other words, the alignment mark 100A is grasped by an image recognition means as a mark having uniform color and uniform brightness (FIG. 5B).

Thus, by the first embodiment, the position and shape of the alignment mark 100A can be grasped with high accuracy by an image recognition means in the wafer process. In other words, by using the alignment mark 100A, the misalignment between the photomask 200A and the underlayer 1 in the wafer process is suppressed as compared to the reference example.

There may be also a method in which the process is advanced such that the self-assembled film 21 is not formed in the region inside the guide pattern feature 12. By this method, no self-assembled film is formed in the region inside the guide pattern feature 12. In other words, the region inside the guide pattern feature 12 becomes a space, or only a single-layer coating is formed in the region inside the guide pattern feature 12. Thereby, no spots are produced in the contrast of the alignment mark.

However, in this method, when a block copolymer is applied onto the underlayer 1, it is necessary to use a mask member to cover the region inside the guide pattern feature 12 in order that the block copolymer may not be applied to the region inside the guide pattern feature 12. Therefore, this method needs a manufacturing process in which a mask member is provided on the region inside the guide pattern features 12. Consequently, the number of manufacturing processes is increased. The first embodiment does not need the process of forming such a mask member, and does not increase the number of manufacturing processes.

Second Embodiment

Figure 6A:
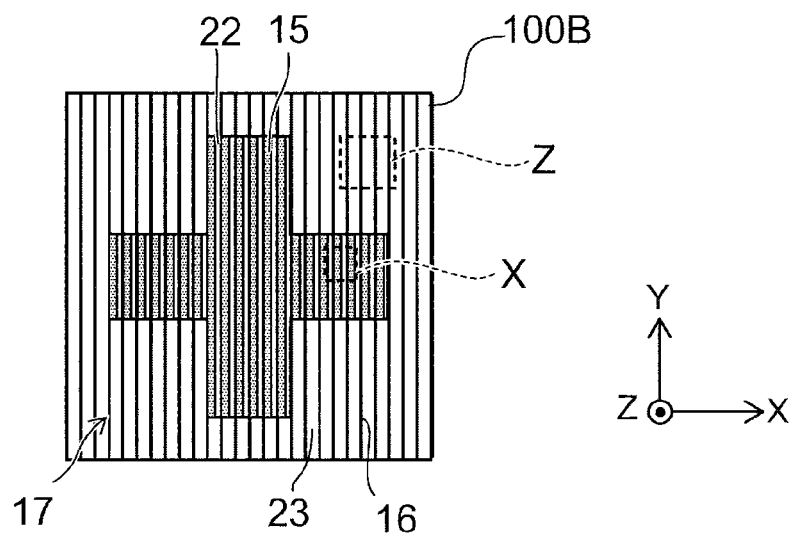
FIG. 6A is a schematic plan view showing an alignment mark according to a second embodiment.
Figure 6B:
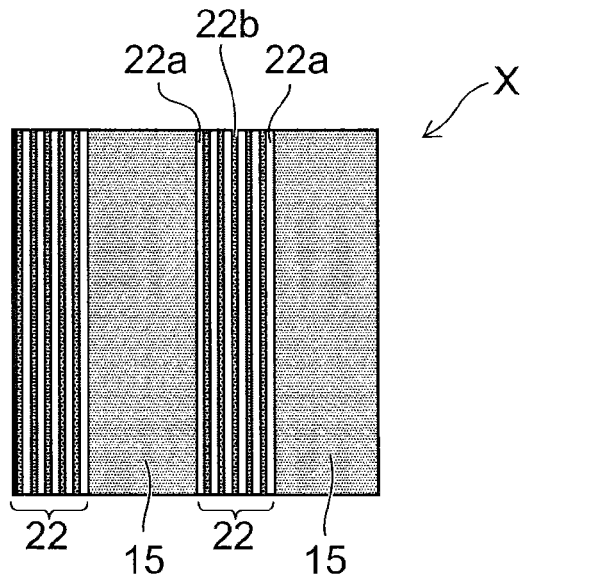
FIG. 6B is an enlarged view of a portion X of FIG. 6A.
Figure 6C:
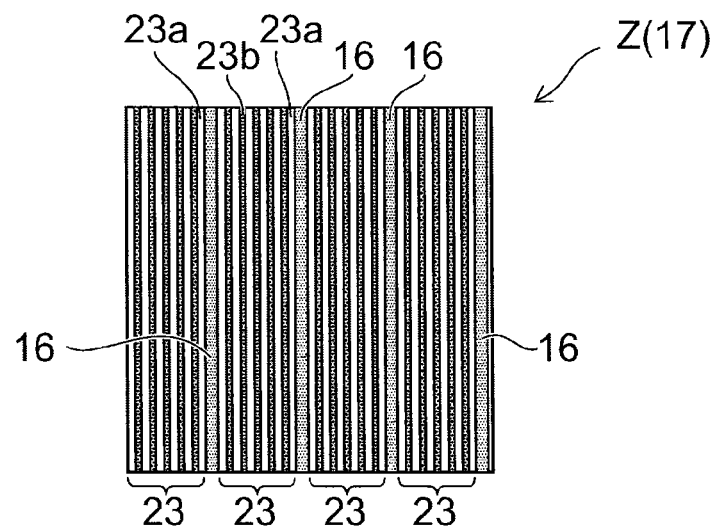
FIG. 6C is an enlarged view of a portion Z of FIG. 6A.

FIG. 6A is a schematic plan view showing an alignment mark according to a second embodiment, FIG. 6B is an enlarged view of a portion X of FIG. 6A, and FIG. 6C is an enlarged view of a portion Z of FIG. 6A.

An alignment mark 100B according to the second embodiment includes, on the underlayer 1, guide pattern features 15, a self-assembled film 22 provided between guide pattern features 15, and a pattern feature 17 surrounding the plurality of guide pattern features 15 and the self-assembled film 22.

Each of the plurality of guide pattern features 15 extends in the Y-direction. The plurality of guide pattern features 15 are aligned in the X-direction crossing the Y-direction. The guide pattern feature 15 is observed with a secondary electron microscope, and has a line width small enough not to be observed with an optical microscope.

The self-assembled film 22 has a plurality of line pattern features 22a and a plurality of line pattern features 22b. The plurality of line pattern features 22a extend in the Y-direction, and are aligned in the X-direction. The pitch of the plurality of line pattern features 22a in the X-direction is narrower than the pitch of the plurality of guide pattern features 15 in the X-direction. Each of the plurality of line pattern features 22b extends in the Y-direction. The line pattern feature 22b is provided between line pattern features 22a.

The pattern feature 17 surrounding the plurality of guide pattern features 15 and the self-assembled film 22 includes a plurality of guide pattern features 16 (third guide pattern features) and a self-assembled film 23 (a second self-assembled film).

The plurality of guide pattern features 16 extend in the Y-direction, and are aligned in the X-direction. The pitch of the plurality of guide pattern features 16 in the X-direction is different from the pitch of the plurality of guide pattern features 15 in the X-direction. For example, the pitch of the plurality of guide pattern features 16 in the X-direction is narrower than the pitch of the plurality of guide pattern features 15 in the X-direction. The width of the guide pattern feature 16 in the X-direction is different from the width of the guide pattern feature 15 in the X-direction. For example, the width of the guide pattern feature 16 in the X-direction is narrower than the width of the guide pattern feature 15 in the X-direction.

The self-assembled film 23 is provided between guide pattern features 16. The self-assembled film 23 has a plurality of line pattern features 23a and a plurality of line pattern features 23b. The plurality of line pattern features 23a extend in the Y-direction, and are aligned in the X-direction. The line pattern feature 23b is provided between line pattern features 23a. The line pattern feature 23b extends in the Y-direction.

The guide pattern features 15 and 16 are an organic layer such as a resist layer, a silicon oxide layer, a silicon nitride layer, or the like. In the embodiment, as an example, an organic layer such as a resist layer is illustrated as the guide pattern features 15 and 16. The guide pattern features 15 and 16 may be a silicon oxide layer, a silicon nitride layer, or the like.

The line pattern features 22a and 23a are a layer containing a polystyrene derivative, for example, and the line pattern features 22b and 23b are a layer containing poly(methyl methacrylate) (an acrylic), for example.

The manufacturing process in which the alignment mark 100B is formed will now be described.

In the manufacturing process in which the alignment mark 100B is formed, a photomask for transferring the pattern configuration of the alignment mark 100B onto the underlayer 1 is used.

Figure 7A:
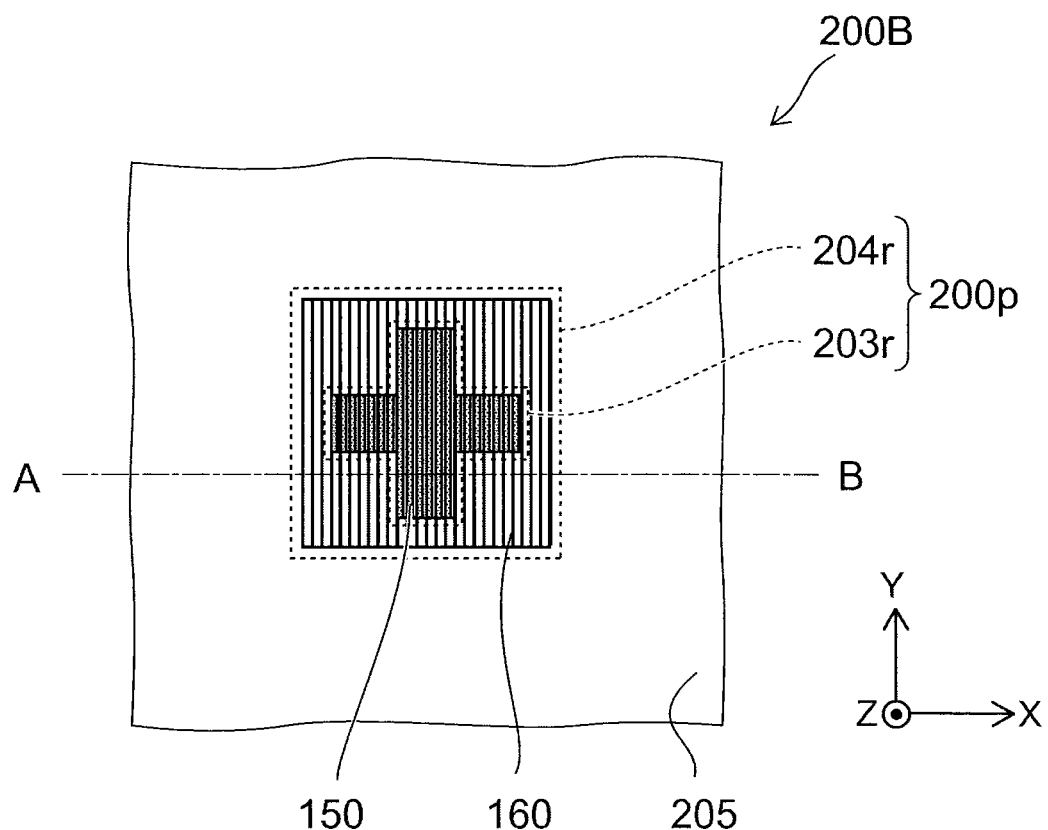
FIG. 7A is a schematic plan view showing a photomask according to the second embodiment.
Figure 7B:
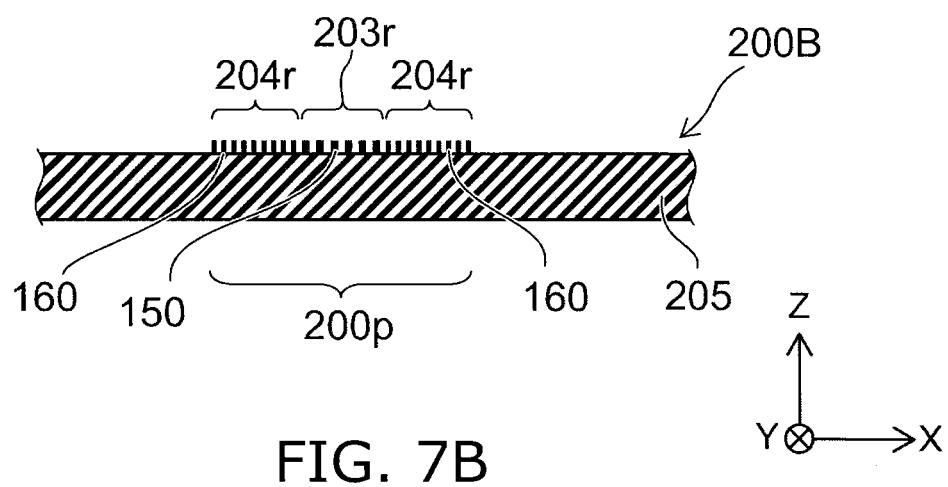
FIG. 7B is a schematic cross-sectional view in a position along line A-B of FIG. 7A.

FIG. 7A is a schematic plan view showing a photomask according to the second embodiment, and FIG. 7B is a schematic cross-sectional view in a position along line A-B of FIG. 7A.

FIG. 7A and FIG. 7B show part of a photomask 200B.

The photomask 200B includes the light transmissive matrix 205 and light blocking films 150 and 160. The photomask 200B has the pattern region 200p where the pattern of the alignment mark 100B can be transferred. The photomask 200B includes, in addition to that pattern region, a pattern region where the pattern of elements, interconnections, etc. can be transferred (not shown).

The pattern region 200p has a pattern region portion 203r and a pattern region portion 204r surrounding the pattern region portion 203r. A plurality of light blocking films 150 are provided in the pattern region portion 203r. The plurality of light blocking films 150 extend in the Y-direction, and are aligned in the X-direction.

A plurality of light blocking films 160 (second light blocking films) are provided in the pattern region portion 204r on the outside of the pattern region portion 203r. The plurality of light blocking films 160 extend in the Y-direction, and are aligned in the X-direction. The pitch of the plurality of light blocking films 160 in the X-direction is different from the pitch of the plurality of light blocking films 150 in the X-direction. The light blocking films 150 and 160 are a metal film containing chromium (Cr) or the like, for example.

Figure 8A:
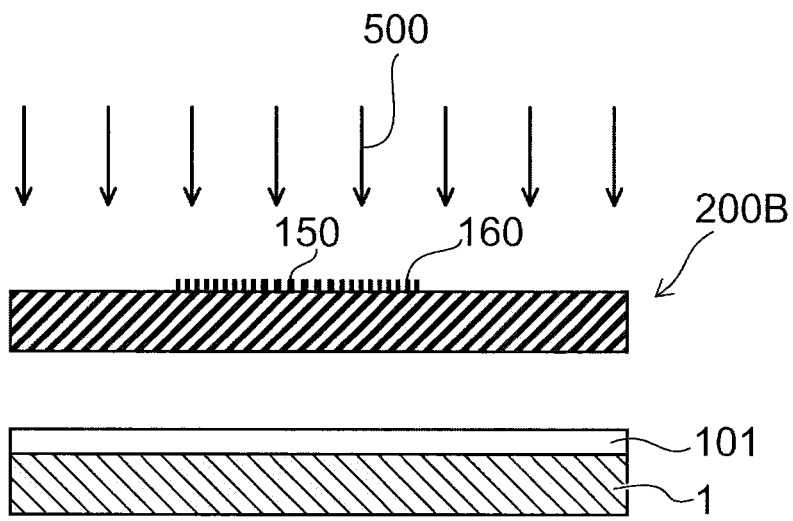
FIG. 8A to FIG. 8C are schematic cross-sectional views showing the manufacturing process in which the alignment mark of the second embodiment is formed.
Figure 8B:
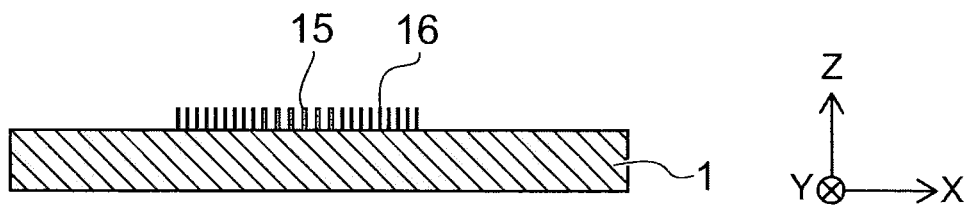
Figure 8C:
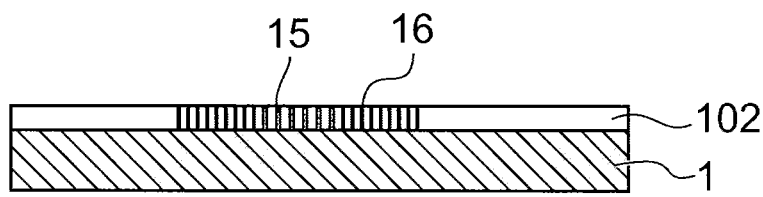

FIG. 8A to FIG. 8C are schematic cross-sectional views showing the manufacturing process in which the alignment mark of the second embodiment is formed.

As shown in FIG. 8A, the photomask 200B is placed above the underlayer 1. The resist 101 has been applied on the underlayer 1 beforehand. Subsequently, light 500 is applied to the resist 101 via the photomask 200B. The resist 101 is a positive resist.

After the exposure and the development, portions of the resist 101 where the light 500 has been blocked by the light blocking films 150 and 160 and the light 500 has not arrived form guide pattern features. FIG. 8B shows this state.

As shown in FIG. 8B, a plurality of guide pattern features 15 and 16 extending in the Y-direction and aligned in the X-direction are formed on the underlayer 1. The plurality of guide pattern features 16 are part of the pattern feature 17 described above. The pitch of the plurality of guide pattern features 16 in the X-direction is different from the pitch of the plurality of guide pattern features 15 in the X-direction.

Although the embodiment illustrates an organic layer such as a resist as the material of the guide pattern feature, it is also possible to form an insulating layer such as a silicon oxide layer and a silicon nitride layer on the underlayer 1 beforehand, and pattern the insulating layer using a resist pattern to obtain insulating pattern features used as guide pattern features (not shown).

Next, as shown in FIG. 8C, the block copolymer layer 102 is formed between guide pattern features 15 and between guide pattern features 16. The block copolymer layer 102 is formed on the underlayer 1 by the spin coating method, for example.

Subsequently, heating treatment is performed on the block copolymer layer 102. By the heating treatment, the organic solvent is vaporized from the block copolymer layer 102, and the block copolymer layer 102 is microphase-separated. The state after the microphase separation is already shown in FIG. 6A to FIG. 6C described above.

That is, a plurality of line pattern features 22a extending in the Y-direction and aligned in the X-direction are formed between guide pattern features 15. The line pattern feature 22b extending in the Y-direction is formed between line pattern features 22a.

Further, a plurality of line pattern features 23a extending in the Y-direction and aligned in the X-direction are formed between guide pattern features 16. The line pattern feature 23b extending in the Y-direction is formed between line pattern features 23a.

In the alignment mark 100B, the pitch in the X-direction of the plurality of guide pattern features 15 is different from the pitch in the X-direction of the plurality of guide pattern features 16. Therefore, the light and dark contrast between the cross-shaped portion and the portion other than the cross-shaped portion is made clear. If the pitch in the X-direction of the plurality of guide pattern features 15 is the same as the pitch in the X-direction of the plurality of guide pattern features 16, the layer structure of the cross-shaped portion and the layer structure of the portion other than the cross-shaped portion result in the same, and the light and dark contrast between the cross-shaped portion and the portion other than the cross-shaped portion is not made clear.

Thus, by the second embodiment, the position and shape of the alignment mark 100B can be grasped with high accuracy by an image recognition means in the wafer process. In other words, by using the alignment mark 100B, the misalignment between the photomask 200B and the underlayer 1 in the wafer process is suppressed as compared to the reference example.

Elements, interconnections, etc. may be formed near the alignment mark. In this case, if a mask layer with a large area like the guide pattern feature 12 is present around the region where the elements, interconnections, etc. will be formed, the micro-loading effect may be caused when the region where the elements, interconnections, etc. will be formed is processed by dry etching. As a result, a restriction that elements, interconnections, etc. cannot be disposed near the alignment mark will be caused.

In the alignment mark 100B according to the second embodiment, the guide pattern feature 12 of the alignment mark 100A is replaced with the guide pattern features 16 (a line-and-space pattern). Thereby, the micro-loading effect is suppressed, and the restriction mentioned above is eliminated.

Hereinabove, exemplary embodiments of the invention are described with reference to specific examples. However, the embodiments of the invention are not limited to these specific examples. Those skilled in the art can suitably modify the specific examples by addition of design variation are also encompassed within the scope of the invention as long as they fall within the features of the embodiments. Components and the arrangement, materials, conditions, sizes included in the specific examples described above are not limited to the illustration, however can be modified suitably.

The components included in the embodiments described above can be complexed as long as technically possible, and the combined components are included in the scope of the embodiments to the extent that the features of the embodiments are included. Various other variations and modifications can be conceived by those skilled in the art within the spirit of the embodiments, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An alignment mark provided on an underlayer comprising:
    a plurality of first guide pattern features extending in a first direction and aligned in a second direction crossing the first direction; and
    a first self-assembled film provided between adjacent ones of the first guide pattern features and including a plurality of first line pattern features and a second line pattern feature, the first line pattern features extending in the first direction, being aligned in the second direction, and having a pitch in the second direction narrower than a pitch in the second direction of the first guide pattern features, the second line pattern feature being provided between adjacent ones of the first line pattern features and extending in the first direction.

2. The mark according to claim 1, further comprising a second guide pattern feature surrounding the first guide pattern features and the first self-assembled film.

3. The mark according to claim 1, further comprising a pattern feature on the underlayer, the pattern feature surrounding the first guide pattern features and the first self-assembled film,
    the pattern feature including:
        a plurality of third guide pattern features extending in the first direction and aligned in the second direction; and
        a second self-assembled film provided between adjacent ones of the third guide pattern features and including a plurality of third line pattern features and a fourth line pattern feature, the third line pattern features extending in the first direction and being aligned in the second direction, the fourth line pattern feature being provided between adjacent ones of the third line pattern features and extending in the first direction.

4. The mark according to claim 3, wherein a pitch of the third guide pattern features in the second direction is different from a pitch of the first guide pattern features in the second direction.

5. The mark according to claim 3, wherein a line width of the third guide pattern features and a line width of the first guide pattern features are different.

6. A photomask comprising a pattern region where a pattern of an alignment mark is allowed to be transferred onto an underlayer,
    the pattern region including:
        a first pattern region portion including a plurality of first light blocking films extending in a first direction and aligned in a second direction crossing the first direction; and
        a second pattern region portion surrounding the first pattern region portion.

7. The photomask according to claim 6, wherein the second pattern region portion includes a plurality of second light blocking films extending in the first direction, aligned in the second direction, and having a pitch in the second direction different from a pitch in the second direction of the first light blocking films.

8. The photomask according to claim 6, wherein a line width of the first light blocking film and a line width of the second light blocking film are different.

9. A method for forming an alignment mark comprising:
    forming a plurality of first guide pattern features on an underlayer, the first guide pattern features extending in a first direction and being aligned in a second direction crossing the first direction;
    forming a block copolymer layer between adjacent ones of the first guide pattern features; and
    phase-separating the block copolymer layer to form a plurality of first line pattern features between adjacent ones of the first guide pattern features and form a second line pattern feature between adjacent ones of the first line pattern features, the first line pattern features extending in the first direction and being aligned in the second direction, the second line pattern feature extending in the first direction.

10. The method according to claim 9, wherein in the forming the first guide pattern features, a second guide pattern feature surrounding the first guide pattern features is formed on the underlayer.

11. The method according to claim 10, wherein the first guide pattern features and the second guide pattern feature include one of a resist and an insulator.

12. The method according to claim 9, wherein the block copolymer layer includes a polystyrene derivative and poly (methyl methacrylate).

13. The method according to claim 9, wherein in the phase-separating, heating treatment is performed on the block copolymer layer to microphase-separate the block copolymer layer.

14. The method according to claim 9, wherein in the forming the first guide pattern features, a pattern feature surrounding the first guide pattern features is formed on the underlayer, the pattern feature includes a plurality of third guide pattern features extending in the first direction and aligned in the second direction, and a pitch of the plurality of third guide pattern features in the second direction is different from a pitch of the first guide pattern features in the second direction.

15. The method according to claim 14, wherein a line width of the third guide pattern features and a line width of the first guide pattern features are different.

16. The method for forming an alignment mark according to claim 9, wherein
- in the forming the block copolymer layer, the block copolymer layer is formed between adjacent ones of the third guide pattern features, and
- in the phase-separating, the block copolymer layer is phase-separated to form a plurality of third line pattern features between adjacent ones of the third guide pattern features and form a fourth line pattern feature between adjacent ones of the third line pattern features, the third line pattern features extending in the first direction and being aligned in the second direction, the fourth line pattern feature extending in the first direction.

* * * * *